United States Patent
Lenglet

(10) Patent No.: US 8,803,520 B2
(45) Date of Patent: Aug. 12, 2014

(54) MAGNETIC CORE WITH SUPERPARAMAGNETIC PARTICLES FOR CURRENT AND MAGNETIC FIELD SENSORS

(75) Inventor: Luc Lucien Marie Lenglet, Levallois-Perret (FR)

(73) Assignee: Neelogy, Cachan (FR)

( * ) Notice: Subject to any disclaimer, the term of this patent is extended or adjusted under 35 U.S.C. 154(b) by 159 days.

(21) Appl. No.: 13/280,517

(22) Filed: Oct. 25, 2011

(65) Prior Publication Data

US 2012/0038360 A1 Feb. 16, 2012

Related U.S. Application Data

(62) Division of application No. 12/089,414, filed as application No. PCT/FR2006/002248 on Oct. 6, 2006, now Pat. No. 8,076,931.

(30) Foreign Application Priority Data

Oct. 7, 2005 (FR) ...................................... 05 10278

(51) Int. Cl.
- *G01R 33/02* (2006.01)
- *G01R 19/00* (2006.01)
- *G01R 33/04* (2006.01)
- *G01R 15/18* (2006.01)

(52) U.S. Cl.
CPC ................................... *G01R 33/04* (2013.01); *G01R 15/185* (2013.01)
USPC ........................ 324/253; 324/117 R; 335/297

(58) Field of Classification Search
CPC .............................. G01R 33/04; G01R 15/185
USPC ............. 324/117 R, 244, 248, 253, 254, 260; 335/297
See application file for complete search history.

(56) References Cited

U.S. PATENT DOCUMENTS

| | | | |
|---|---|---|---|
| 6,670,809 B1 | 12/2003 | Edelstein et al. | |
| 7,564,245 B2 * | 7/2009 | Lee | 324/321 |
| 2005/0225322 A1 | 10/2005 | Muller et al. | |
| 2009/0134869 A1 * | 5/2009 | Lee | 324/309 |
| 2011/0140694 A1 * | 6/2011 | Cima et al. | 324/253 |

FOREIGN PATENT DOCUMENTS

| | | |
|---|---|---|
| FR | 2687478 | 8/1993 |
| JP | 61179423 A | 8/1986 |
| JP | 3163805 A | 7/1991 |

(Continued)

OTHER PUBLICATIONS

Afanas'ev Y V, "On the theory of flux gates with output at fundamental frequncy", Mar. 1999, vol. 42, No. 3, pp. 283-292.

*Primary Examiner* — Jay Patidar
(74) *Attorney, Agent, or Firm* — Young & Thompson

(57) ABSTRACT

A magnetic core for a magnetic field sensor is made from a material having a solid matrix in which are dispersed superparamagnetic particles, the solid matrix being chosen so as not to perturb the magnetic properties of the superparamagnetic particles, and so that the superparamagnetic particles represent a percentage P of the total volume of the core chosen to be greater than 2.5% or chosen in the span defined by the relation L $10\% \leq P \leq L-1\%$ where L corresponds to a threshold L beyond which the core loses the superparamagnetic properties. A magnetic field sensor that includes the magnetic core and an electronic circuit for measuring a magnetic field induced in the magnetic core.

35 Claims, 4 Drawing Sheets

(56) References Cited

FOREIGN PATENT DOCUMENTS

| | | |
|---|---|---|
| JP | 5072233 A | 3/1993 |
| JP | 6018568 A | 1/1994 |
| JP | 2004342943 A | 12/2004 |
| JP | 2004361248 A | 12/2004 |
| JP | 2005265621 A | 9/2005 |

* cited by examiner

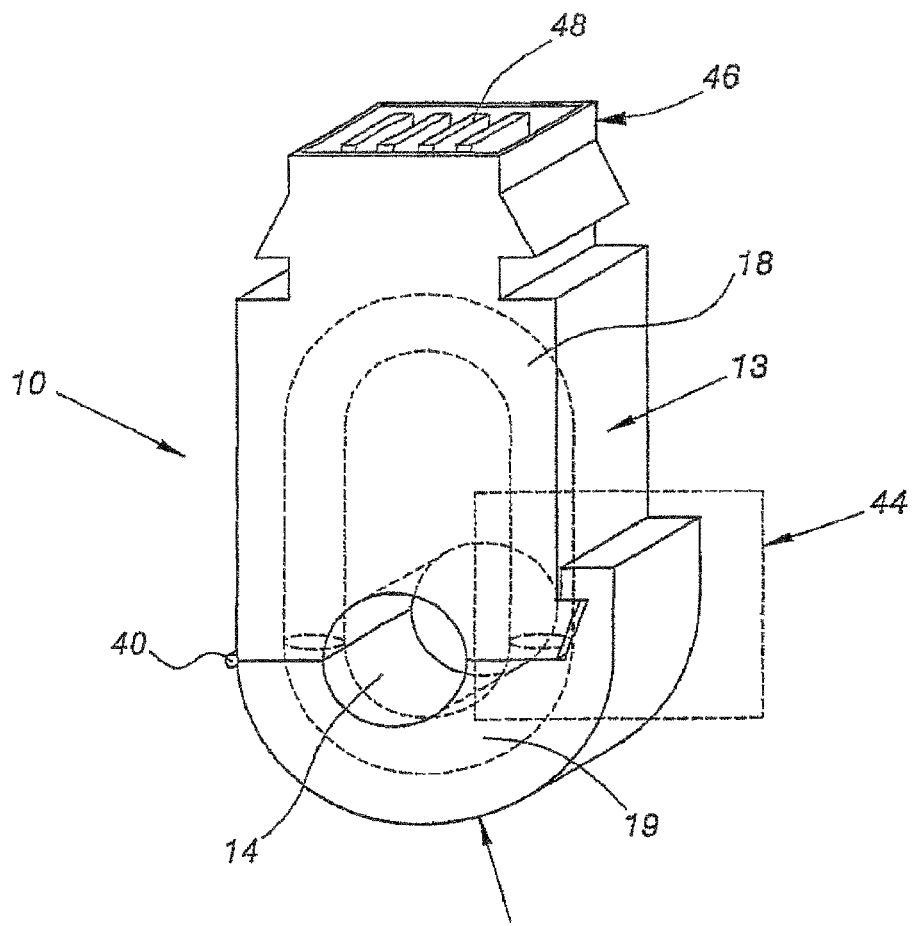
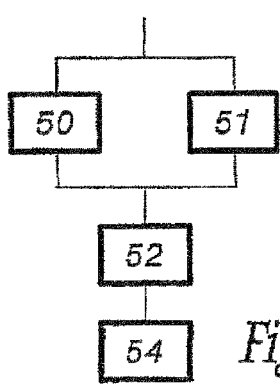

MAGNETIC CORE WITH SUPERPARAMAGNETIC PARTICLES FOR CURRENT AND MAGNETIC FIELD SENSORS

CROSS REFERENCE TO RELATED APPLICATIONS

This application is a division of copending application Ser. No. 12/089,414 filed on Apr. 7, 2008; which is the 35 U.S.C. 371 national stage of International application PCT/FR06/02248 filed on Oct. 6, 2006; which claims priority to French application 0510278 filed Oct. 7, 2005. The entire contents of each of the above-identified applications are hereby incorporated by reference.

BACKGROUND OF THE INVENTION

The present invention relates to magnetic field and current sensors, a control method and a magnetic core for these sensors.

Magnetic field sensors find numerous applications in industry. For example, they are used to carry out measurements of current in the automobile or aeronautics sector.

Field sensors often use a magnetic core to concentrate the magnetic flux on the transducer so as to amplify the signal.

In general the magnetic material from which the core is made introduces undesirable non-linearities of hysteresis types which perturb the measurement and require zero-field operation, through the conventional technique of flux feedback.

Certain magnetic cores are also used as magnetic-field transducers or modulators. These cores must then exhibit strong non-linearities, characterized by a relative permeability which varies as a function of the magnetic field. The materials conventionally used to make these cores are soft magnetic alloys. To control hysteresis problems, isotropic alloys (for example Mu-metals®) or anisotropic alloys of the oriented nanocrystalline strip type are used. Whatever the material, an excitation field which will more or less saturate the material is used. Specifically, the saturation of the magnetic material creates a significant point of inflection in the magnetic cycle B(H) of these materials. This point of inflection is the non-linearity which is used to modulate the magnetic field. More precisely, the presence of an external field to be measured will increase the saturation and thus generate harmonics which will be detected. It is also possible to say that the external field is used to modulate the excitation field.

There therefore exist magnetic field sensors having:
  at least one magnetic core able to modulate the amplitude of a magnetic excitation field as a function of the amplitude of the magnetic field to be measured, this magnetic core exhibiting a magnetic cycle of the magnetic induction as a function of the magnetic field devoid of hysteresis in an operating span $[H_{min}; H_{max}]$, and
  an electronic circuit tied to the magnetic core and able to measure the magnetic field induced in the magnetic core, this induced magnetic field resulting from the combination of the magnetic field to be measured and the magnetic excitation field.

When the material is saturated, the relative permeability drops abruptly and the core then loses its flux concentration capability.

The invention is aimed at remedying this drawback by proposing a magnetic field sensor using a magnetic core to modulate the excitation field as a function of the magnetic field to be measured without it being necessary to saturate the magnetic core.

SUMMARY OF THE INVENTION

The subject of the invention is therefore a magnetic field sensor in which the magnetic cycle of the magnetic core is characterized in that the absolute value of the third derivative of the magnetic induction with respect to the magnetic field is a maximum for a zero magnetic field.

It has been discovered that the magnetic cores exhibiting the property of the magnetic cycle hereinabove exhibit a sufficiently significant non-linearity about the zero magnetic field to make it possible to modulate the amplitude of the magnetic excitation field by the amplitude of the magnetic field to be measured without it being necessary to saturate the magnetic core for this purpose.

The embodiments of this sensor can comprise one or more of the following characteristics:
  the electronic circuit is able to generate a magnetic excitation field and/or a feedback magnetic field suitable for permanently maintaining the amplitude of the induced magnetic field in the operating span $[H_{min}; H_{max}]$ situated around 0 and in which the magnetic core is never saturated.
  the magnetic core is a superparamagnetic core.
  the electronic circuit comprises at least one transducer suitable for converting the magnetic field induced in the magnetic core into an electrical voltage or current, this transducer comprising for this purpose a sensitive surface intended to be exposed to the flux of the magnetic field induced, and the magnetic core is devised so as to concentrate the magnetic flux of the magnetic field to be measured on this sensitive surface;
  the transducer is embedded inside the magnetic core;
  the electronic circuit comprises at least one excitation winding able to create the excitation field, this or each of the excitation windings being embedded inside the magnetic core;
  the core comprises:
    a magnetic body in which is made a housing suitable for receiving an electrical conductor radiating the magnetic field to be measured,
    a magnetic clasp displaceable between an open position in which the conductor can be introduced into the housing, and a closed position in which the conductor is maintained in the housing, and
    a closing mechanism suitable for maintaining the clasp in its closed position, this mechanism being integral on one side with the clasp and on the other side with the body;
    a through-housing and an access passage to this housing are formed in the magnetic core, the housing being able to receive an electrical conductor radiating the magnetic field to be measured, and the access passage being sufficiently narrow in the absence of exterior loading to retain the conductor inside the housing, and under the action of an exterior force, the core is deformable elastically so as to allow the enlargement of the passage by reversible elastic deformation when the conductor has been fully introduced inside the housing;
    the superparamagnetic core is formed of a solid matrix in which are dispersed superparamagnetic particles spaced sufficiently far apart so that the core is superparamagnetic;

the superparamagnetic particles represent at least 5% of the volume of the matrix in which they are incorporated;

the matrix is a plastic;

the electronic circuit is able to extract the amplitude of one or more of the harmonics of the field induced which is a multiple (are multiples) of the frequency of the excitation field, these extracted amplitudes being representative of the magnetic field to be measured.

These embodiments of the magnetic field sensor furthermore exhibit the following advantages:

the fact of preventing the saturation of the magnetic core ensures that the core permanently fulfills the flux concentrator function and allows the transducer to operate in its linear response zone;

the magnetic properties of a superparamagnetic core are highly non-linear although not exhibiting any hysteresis and even when the magnetic field is much less than the saturation field;

the magnetic properties of a superparamagnetic core are less sensitive to mechanical deformations than a magnetic core made from oriented nanocrystalline strips, thereby facilitating their fabrication;

concentrating the magnetic flux on the sensitive surface of the transducer improves the sensitivity of the sensor, embedding the transducer inside the magnetic core makes it possible to isolate this transducer from exterior spurious magnetic fields and protects the transducer, embedding the excitation winding inside the magnetic core protects this winding and limits the significance of the magnetic excitation field radiated outside the superparamagnetic core;

making a closing mechanism integral with the core decreases the fabrication costs and limits the number of pieces of the field sensor;

providing an elastically deformable magnetic core makes it possible to avoid recourse to hinges in order to allow the introduction of an electrical conductor inside a housing passing through the core;

introducing more than 5% by volume of superparamagnetic particles into the matrix improves the magnetic properties of the core, consequently improving the performance of the sensor;

using a plastic material matrix facilitates the fabrication of the superparamagnetic core and lightens its weight.

The invention also relates to a magnetic core adapted for being implemented in the field sensor hereinabove.

The invention also relates to a current sensor comprising:

the magnetic field sensor hereinabove for measuring the magnetic field radiated by the electrical conductor, this sensor being able to deliver a value representative of the radiated magnetic field, and a calculator suitable for establishing the intensity of the current on the basis of the value representative of the radiated magnetic field.

The invention also relates to a method of controlling the magnetic field sensor hereinabove comprising a step of generating an excitation field and/or a feedback field suitable for permanently maintaining the amplitude of the magnetic field induced in the core in the operating span $[H_{min}; H_{max}]$ situated around 0 and in which the magnetic core is never saturated.

BRIEF DESCRIPTION OF THE DRAWINGS

The invention will be better understood on reading the description which follows, given solely by way of example and while referring to the drawings in which:

FIG. 2 is a view in perspective of a first embodiment of a superparamagnetic core of the sensor of FIG. 1, FIG. 4 is a flowchart of a method of controlling the sensor of FIG. 1.

FIG. 1 represents a sensor 2 of the current flowing within an electrical conductor 4. This sensor 2 comprises a sensor 6 of the magnetic field $H_m$ radiated by the conductor 4 and a calculator 8 suitable for establishing the intensity of the current flowing within the conductor 4 on the basis of the magnetic field measured by the sensor 6.

Figure 1:
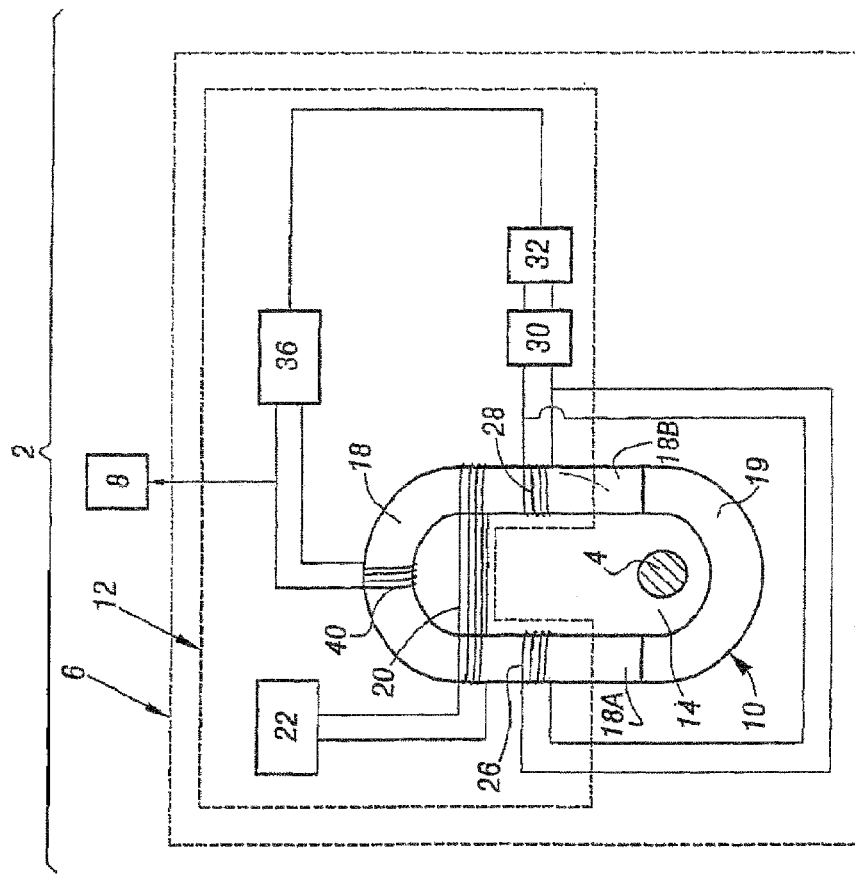
FIG. 1 is a diagrammatic illustration of the architecture of a current sensor incorporating a magnetic field sensor.

The sensor 2 is, for example, an ammeter clamp.

The sensor 6 is equipped with a magnetic core 10 and an electronic circuit 12 fixed to the core 10. The core 10 is, preferably, a superparamagnetic core.

The core 10 surrounds the conductor 4 in such a way that the magnetic field measurement is independent of the position of the conductor. For this purpose, the core 10 is formed of a superparamagnetic body 13 (FIG. 2) in which is made a housing 14 intended to receive the conductor 4, and of a superparamagnetic clasp 16. The clasp 16 is displaceable between an open position in which the conductor 4 can be introduced into the housing 14 and a closed position in which the conductor 4 is maintained in the housing 14.

Here, the body 13 is formed of a superparamagnetic web 18 in the form of a "U" exhibiting two vertical limbs 18A and 18B.

Likewise, the clasp 16 is formed of a superparamagnetic cradle 19. The clasp 16, when it is in the closed position, magnetically links the free ends of the web 18 to the free ends of the cradle 19, so as to form a closed circuit of superparamagnetic material surrounding the housing 14.

The web 18 and the cradle 19 are made from the same superparamagnetic material.

To simplify FIG. 1, only the web 18 and the cradle 19 are represented.

Other details of the core 10 will be described below with regard to FIG. 2.

Figure 3A:
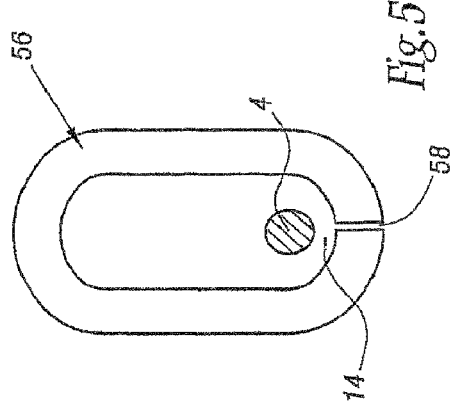
FIG. 3A is a graph representing the evolution of the magnetic induction ($\overline{B}$) as a function of the magnetic field induced ($\overline{H}$) in the core of FIG. 2.

A superparamagnetic core exhibits a magnetic cycle B(H), a typical example of which is represented in the graph of FIG. 3A. In FIG. 3A, the abscissa axis represents the magnetic field H in amperes per meter and the ordinate axis represents the magnetic induction B in Teslas.

Figure 3B:
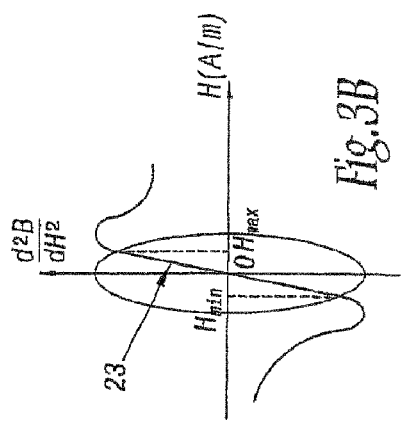
FIG. 3B is a graph representing the evolution of the second derivative of the magnetic induction ($\overline{B}$) as a function of the magnetic field induced ($\overline{H}$) in the core of FIG. 2.

FIG. 3B represents for its part the evolution as a function of the magnetic field H of the second derivative of the magnetic induction B. This second derivative exhibits an almost linear and highly inclined slope 23 (surrounded by an ellipse). This slope 23 is centered on the zero value of the magnetic field H and lies between bounds $H_{min}$ and $H_{max}$.

Figure 3C:
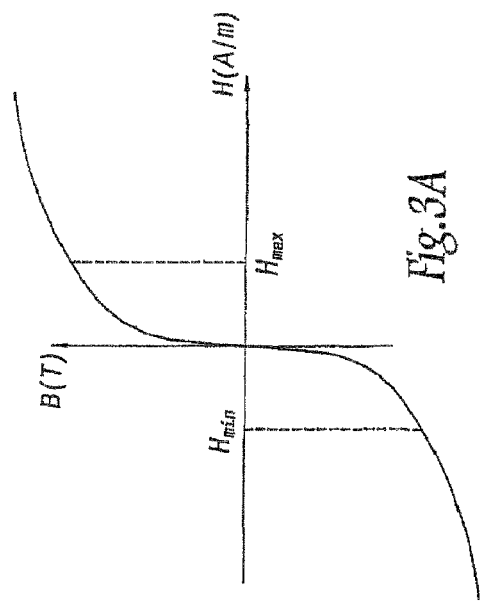
FIG. 3C is a graph representing the evolution of the relative permeability of the core of FIG. 2 as a function of the magnetic field induced in this core.

FIG. 3C gives a typical example of the variations in the relative permeability as a function of the magnetic field induced in the core 10. These variations are non-linear, and more precisely parabolic, between the bounds $H_{min}$ and $H_{max}$.

A superparamagnetic material is characterized by the fact that:
1) it does not exhibit any magnetic remanence, so that the magnetic induction B is zero or almost zero when the magnetic field H is zero;
2) it does not exhibit any hysteresis, so that the magnetization curve coincides with the demagnetization curve in the magnetic cycle B(H);
3) the relative permeability varies continuously and in a non-linear manner as a function of the magnetic field;
4) the magnetic cycle B(H) exhibits the same shape and the same properties whatever the direction of the magnetic field H; and
5) the absolute value of the third derivative of the magnetic induction B with respect to the magnetic field H exhibits a maximum when the magnetic field H is zero.

Characteristic 2) differentiates superparamagnetic materials from soft magnetic alloys such as Mu-metals®.

Characteristic 4) differentiates superparamagnetic materials from an oriented nanocrystalline strip since the latter exhibits a magnetic cycle B(H) without hysteresis and without magnetic remanence only for a single predetermined direction of the magnetic field H. Consequently, the orientation of the superparamagnetic core in relation to the magnetic field to be measured is of no significance, whereas this is not the case when the core is made with the aid of an oriented nanocrystalline strip.

Characteristic 5) results from the fact that the magnetic cycle B(H) is highly non-linear about the zero magnetic field. It also follows from this that the slope 23 is highly inclined. Thus, a weak variation in the magnetic field H results in a significant variation in the second derivative of the magnetic induction B and also in a significant variation in the amplitude of the even harmonics in the measured signal. The even harmonics are defined as being the harmonics whose frequency is an integer multiple $\underline{N}$ of the frequency of the magnetic excitation field, $\underline{N}$ being an even number. This explains that the sensor 6 exhibits very good sensitivity in relation to the variations in the magnetic field to be measured about the zero magnetic field.

Moreover, the slope 23 is linear or almost linear over the operating span of the sensor 6, so that the conversion of the measured signal into a magnetic field value is simplified.

Here, the superparamagnetic material used to make the web 18 and the cradle 19 comprises a solid matrix within the thickness of which are incorporated superparamagnetic particles. The superparamagnetic particles are, for example, ferromagnetic particles whose largest width is sufficiently small for them, taken individually, to exhibit a magnetic cycle B(H) having the same properties as that of FIG. 3. Typically, the largest width of the ferromagnetic particles is chosen less than 100 nanometers and usually less than 20 nanometers. This largest width of the ferromagnetic particle short of which it becomes superparamagnetic is dependent on the ferromagnetic material used. Superparamagnetism as well as superparamagnetic particles are presented in the following bibliographic reference: E. du Trémolet de lacheisserie and coll "Magnétisme" VOL 1, Presses Universitaire de Grenoble, 1999.

The oxides of iron are the preferred superparamagnetic particles. To be more complete, it may be specified that the superparamagnetic particles can be chosen from among oxides of iron and mixed oxides of iron and of another metal, in particular chosen from among Mn, Ni, Zn, Bi, Cu, Co. The iron oxides $Fe_3O_4$ and $Fe_2O_3$ are preferred modalities. It is also possible to use: perovskites having superparamagnetic properties, in particular perovskites based on Fe, superparamagnetic oxides of nickel, of cobalt or mixed oxides of these metals, or else superparamagnetic metallic alloys, e.g. of the FeNi, CoNi type, in particular $Fe_{20}Ni_{80}$.

The solid matrix is chosen so as not to perturb the magnetic properties of the superparamagnetic particles. For example, the solid matrix is solely diamagnetic.

It will also be noted that here the term "solid" also denotes matrices made of reversibly elastically deformable material, such as elastomers.

The various materials capable of giving rise to a solid matrix within the sense of the invention can be used. Preferably, the matrix is a plastic, in particular chosen from among the thermosets (e.g. phenoplasts, aminoplasts, epoxy resins, unsaturated polyesters, crosslinked polyurethanes, alkyds) and the thermoplastics (e.g. polyvinyls, polyvinyl chlorides, polyvinyl acetates, polyvinyl alcohols, polystyrenes and copolymers, acrylic polymers, polyolefins, cellulose derivatives, polyamides), or else special polymers (e.g. fluorinated polymers, silicones, synthetic rubber, saturated polyesters, linear polyurethanes, polycarbonates, polyacetals, polyphenylene oxides, polysulfones, polyethersulfones, phenylene polysulfides, polyimides). The elastomers can in particular be of the silicone or synthetic rubber type.

The choice of the material constituting the matrix may be made as a function of the final application, and in particular as a function of the conditions of use. Thus, in the automobile industry, matrices that withstand common temperatures of use are advocated, in particular temperatures ranging from −30° C. to +150° C. For aeronautics, the typical temperature span which the matrix must withstand ranges from −40° C. to +100° C.

At the material preparation stage, the superparamagnetic particles can be incorporated in pulverulent form into the material intended to form the matrix or into a fraction or part of this material. They can also be supplied already dispersed in a medium which will be mixed with the material intended to form the matrix, or with a fraction or part of this material. In all cases, mixing must be sufficient to ultimately obtain an appropriate dispersion of the particles throughout the matrix.

The material can be directly formed in bulk, or be obtained on the basis of beads, pellets or the like of matrix including the superparamagnetic particles, which are thereafter agglomerated under pressure, sintering, melting or any other suitable method.

Thus, the material can be produced by mixing the constituent or constituents of the matrix with a suspension of superparamagnetic particles in an organic phase miscible with the constituent or constituents of the matrix, followed by polymerization. The organic phase containing the superparamagnetic particles can be formed of or comprise an organic solvent, or else be formed of or comprise one or more constituents of the matrix. By way of example, the material is produced by polymerization in emulsion, e.g. the superparamagnetic particles are dispersed in an organic phase containing the constituent or constituents of the matrix, then the dispersion obtained is mixed with all or part of an aqueous solution formed of water and of at least one emulsifying agent, then the whole is homogenized and finally polymerized. By way of illustration, it is possible to implement the emulsion polymerization method described in FR-A-2480764.

Here, to facilitate the fabrication of the core 10, the matrix is made of thermoplastic or thermosetting material.

The distribution of the superparamagnetic particles inside the matrix is such that the distances between superparamagnetic particles are sufficient for the macroscopic core formed by this matrix and the superparamagnetic particles to exhibit the same magnetic properties as the particles which form it.

Preferably, the distribution of the superparamagnetic particles inside the matrix is homogeneous, so as to have a homogeneous spatial distribution of the magnetic properties.

The superparamagnetic particles represent a percentage P of the total volume of the superparamagnetic core. Typically, the percentage P is chosen greater than 2.5% and preferably greater than 5% or than 15%.

There exists a threshold L for the percentage P, beyond which the core formed by this matrix and these superparamagnetic particles loses its superparamagnetic properties since the distances between the superparamagnetic particles are too short, so that the superparamagnetic particles are coupled to one another magnetically and so behave as a ferromagnetic particle whose largest width exceeds the threshold beyond which the superparamagnetic properties disappear.

The percentage P is chosen as close as possible to this limit L without exceeding it. For example, the percentage P is chosen in the span defined by the following relation:

$$L-10\% \leq P \leq L-1\%.$$

The higher the percentage P the higher the ability of the core 10 to concentrate the flux to be measured, thereby improving the performance of the sensor 6.

The relative permeability $\mu$ of the core 10 is, preferably, strictly greater than 1 so as to concentrate the magnetic flux. Here, the maximum value $\mu_{max}$ of the relative permeability of the core 10 is obtained for a zero value of the magnetic field induced in the core 10. For example, the value $\mu_{max}$ is greater than 1.5.

The circuit 12 is able to excite with the aid of a magnetic excitation field $H_{ex}$ the core 10 and to measure the magnetic field induced $H_i$ in the core 10 in response to this excitation.

The field $H_{ex}$ is an alternating magnetic field whose frequency is at least twice as large as that of the magnetic field to be measured. Typically, the frequency of the magnetic field $H_{ex}$ is greater than 100 Hz and preferably greater than 1000 Hz.

The amplitude of the magnetic field $H_{ex}$ lies between the bounds $H_{min}$ and $H_{max}$.

The circuit 12 comprises an adjustable source for creating the field $H_{ex}$. This source is, for example, formed of an excitation winding 20 supplied with AC current of frequency $F_0$ by a controllable power supply source 22.

The winding 20 is wound around the web 18, in such a way that the field $H_{ex}$ has the same direction in the limbs 18A and 18B.

The circuit 12 also comprises at least one transducer suitable for transforming the magnetic field induced $H_i$ in response to the field $H_{ex}$ inside the core into an electrical signal such as a measurable current or voltage. For this purpose, the or each of these transducers exhibits a surface sensitive to the field $H_i$.

Here, the circuit 12 comprises two transducers 26 and 28 sensitive to the fields $H_i$ inside, respectively, the vertical limbs 18A and 18B.

For example, the transducers 26 and 28 are measurement windings coiled, respectively, around the vertical limbs 18A and 18B.

The transducers 26 and 28 are linked in a differential manner to the input of a passive filter 30. Thus, in the absence of any magnetic field to be measured, the electrical signal at the input of the filter 30 is zero. Such a differential arrangement of the transducers 26 and 28 makes it possible to increase the sensitivity of the sensor 6.

The filter 30 makes it possible to perform a prefiltering so as to rid the measured electrical signal of the harmonics which are of no interest to the subsequent processing.

The output of the filter 30 is linked to the input of an amplitude demodulator 32 suitable for extracting one or more of the harmonics of the signal received as input whose frequencies are multiples of $F_0$, $F_0$ being the frequency of the excitation field. Preferably, if a single harmonic is measured, the frequency of the extracted harmonic is $N \cdot F_0$, where N is an even number to facilitate the processing of the signal. For example, here, N is equal to 2.

The filter 32 is, for example, a synchronous detector linked to the power supply source 22.

The circuit 12 also comprises a field feedback to render the sensor 6 more robust in relation to temperature variations and to increase its linearity span.

The field feedback is also used here to maintain the amplitude of the field $H_i$ permanently in the operating span $[H_{min}; H_{max}]$ situated around 0, and preferably centered around the value 0. The operating span $[H_{min}; H_{max}]$ is represented in FIGS. 3B and 3C.

Preferably, the values of the bounds $H_{min}$ and $H_{max}$ are selected to correspond to an operating span in which the core 10 is never saturated.

For this purpose, the circuit 12 is equipped with a regulator 36, an input of which is linked to an output of the demodulator 34 and outputs of which are linked to a field feedback winding 40. The regulator 36 is able to control the winding 40, in such a way that the latter creates a feedback magnetic field $H_c$ suitable for cancelling the magnetic field $H_m$ to be measured.

For this purpose, the winding 40 is coiled around the web 18.

The current flowing around the winding 40 is representative of the magnetic field to be measured.

One of the outputs of the regulator 36 is linked to the calculator 8.

FIG. 2 represents the exterior aspect of the core 10. The web 18, the windings 20 and 40 and the transducers 26 and 28 are embedded inside the body 13. The cradle 19 is embedded inside the clasp 16.

The body 13 and the clasp 16 are made entirely of superparamagnetic material. For example, the same superparamagnetic material as that of the web 18 and the cradle 19 is used to make the assembly of the body 13 and clasp 16.

For example, the body 13 and the clasp 16 are obtained by overmolding respectively the web 18 and the clasp 16.

As illustrated in FIG. 2, the core 10 also comprises a hinge 40 for mechanically linking an end of the clasp 16 to the body 13 while allowing displacement of this clasp 16 between its open position and its closed position.

On the opposite side from the hinge 40, the core comprises a closing mechanism 44 suitable for maintaining the clasp 16 in its closed position. This mechanism 44 is integral with the body 13 and the clasp 16.

More precisely, here, the mechanism 44 is formed of a first profile with hollows and bumps on a surface of the body 13 and of a second profile with hollows and bumps formed on the clasp 16. The first and second profiles are suitable for cooperating with one another to maintain the clasp 16 in its closed position.

A part of the body 13 is also devised to form a connector 46 containing lugs 48. The lugs 48 are linked electrically to the windings 20 and 40 as well as to the transducers 26 and 28 embedded inside the body 13. These lugs 48 make it possible to link these windings 20 and 40 and the transducers 26 and 28 to the corresponding elements of the circuit 12.

The operation of the sensor 2 will now be described with regard to the method of FIG. 4.

When a continuous or alternating current flows in the conductor 4, the latter engenders the creation of the magnetic field $H_m$ inside the core 10.

During a step 50, the winding 20 creates the field $H_{ex}$ inside the core 10. In parallel, during a step 51, the winding 40 creates the magnetic field $H_c$ which circulates around the conductor 4 inside the core 10.

The magnetic field induced $H_i$ inside the core 10 and to which the transducers 26 and 28 are sensitive is therefore the result of the vector sum of the fields $H_m$, $H_{ex}$ and $H_c$.

During steps 50 and 51, the circuit 12 generates the fields $H_{ex}$ and $H_c$ in such a way that the amplitude of the induced magnetic field $H_i$ is maintained in the span $[H_{min}; H_{max}]$. Thus, the core 10 is not saturated and can preserve a good ability to concentrate the magnetic flux.

The induced magnetic field is transformed, during a step 52, into current by the transducers 26 and 28.

All the following steps of processing the current produced by the transducers 26 and 28 in order to obtain a magnetic field value and the intensity of the current flowing around the conductor 4 are grouped together in a step 54 represented in FIG. 4.

The filter 30 filters the difference between the currents generated by the transducers 26 and 28 to obtain a filtered signal. The filter 32 extracts the harmonic of frequency $N \cdot F_0$ from the filtered signal. The appearance of this harmonic at the frequency $N \cdot F_0$ is related to the non-linearity of the magnetic cycle B(H) of the core 10 and therefore to the non-linear variations in the relative permeability of the core 10. More precisely, the deformations of the field $H_{ex}$ that are due to these non-linearities vary as a function of the amplitude of the field $H_m$. These deformations of the field $H_{ex}$ result in the presence of harmonics that are multiples of $F_0$ in the induced magnetic field measured by the transducers 26 and 28.

The demodulator 34 establishes the amplitude of the harmonic of frequency $N \cdot F_0$.

This amplitude is used by the regulator 36 to control the winding 40, so as to generate a field $H_c$ of opposite direction and opposite amplitude to the field $H_m$.

The feedback signal generated by the regulator 36 is therefore representative of the amplitude A of the field $H_m$.

The calculator 8 delivers a signal proportional to the intensity of the current flowing around the conductor 4, this signal being established on the basis of the amplitude A.

Figure 5:
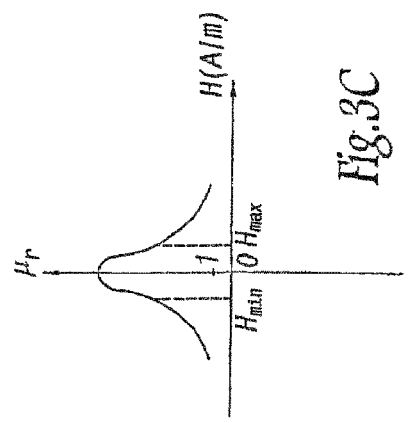
FIG. 5 is a graph representing a second embodiment of a superparamagnetic core.

FIG. 5 represents a superparamagnetic core 56 capable of being used instead of the core 10 in the sensor 2. The core 56 differs from the core 10 by the fact that the matrix used to make it is not a plastic or thermosetting matrix but an elastomer matrix. Therefore, the core 56 is elastically deformable.

A through-hole is made inside this core 56 to make the housing 14.

A passage 58 is also made in the core 56 to allow the introduction of the conductor 4 into the housing 14.

In the absence of exterior loading, the passage 58 is sufficiently narrow to retain the conductor 4 inside the housing 14.

To introduce the conductor 4 into the housing 14, the core 56 is deformed elastically so as to enlarge the passage 58 under the action of an exterior force.

Thus, in this embodiment, it is not necessary to provide a hinge, such as the hinge 40, or a closing mechanism, such as the mechanism 44.

The windings and the transducers are, for example, incorporated inside the core 56 in a manner identical to that described with regard to the core 10.

Figure 6:
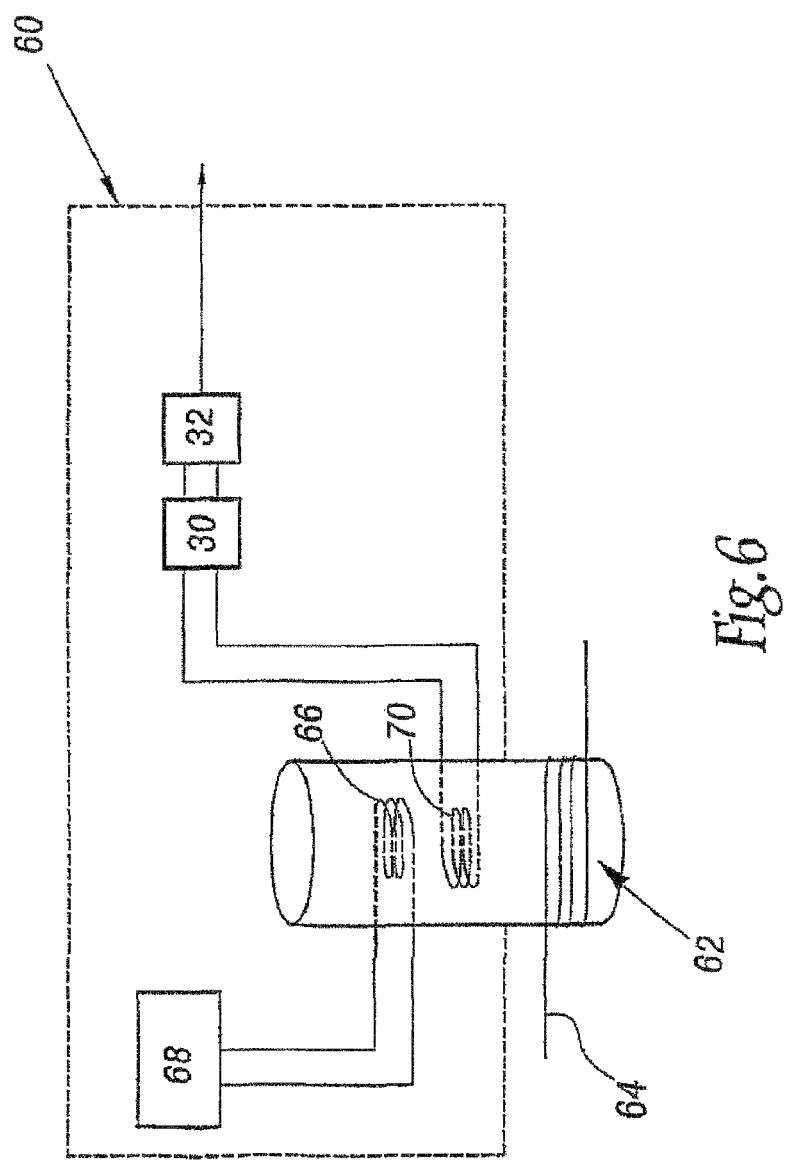
FIG. 6 represents another embodiment of a current sensor using a magnetic field sensor.

FIG. 6 represents a field sensor 60 which differs from the sensor 6 essentially by the fact that it comprises a superparamagnetic core 62 surrounded by a conductor 64 generating the magnetic field to be measured. The fact that the conductor 64 surrounds the core 62 makes it possible to render the magnetic field measurement independent in relation to the position of the conductor 64.

Here, the core 62 incorporates an excitation coil linked to a power supply source 68 identical, for example, to the source 22.

The core 62 also incorporates a coil 70 for measuring the magnetic field induced inside the core 62. This coil 70 is, for example, linked successively to the filter 30, to the filter 32 and to the demodulator 34. The output of the demodulator 34 is representative of the amplitude of the measured magnetic field.

In the embodiment of FIG. 6, the field feedback is omitted. In that case, the amplitude of the magnetic excitation field is adjusted at the level of the source 68 so that, when said field combines with the magnetic field to be measured to form the magnetic field induced $H_i$ inside the core 62, the amplitude of the field $H_i$ remains in the span $[H_{min}; H_{max}]$. This adjustment is, for example, done in a manual manner as a function of prior knowledge about the range of amplitudes of the magnetic field to be measured.

The operation of the sensor 60 ensues from the operation of the sensor 6 and will therefore not be described here in detail.

Numerous other embodiments of the magnetic field sensor are possible. For example, the excitation and measurement coils can be merged. Likewise, the excitation coil and the field feedback coil can also be merged.

The field feedback can be omitted.

To decrease the costs, one of the transducers 26 or 28 can be dispensed with.

In a very simplified variant, the superparamagnetic core does not completely surround the conductor generating the magnetic field to be measured.

The measurement of harmonics may amount to a single harmonic; in this case an even harmonic, that is to say N=2, will preferably be chosen.

The coils as well as the transducers can be embedded inside the superparamagnetic core by any type of molding or overmolding method.

The coils may also not be embedded inside the superparamagnetic core but merely wound around the latter and fixed to this core by any appropriate means such as, for example, with the aid of adhesive resin.

The closing mechanism is not necessarily integral with the clasp and the body. For example, it can be fixed to the clasp and the body by all types of fixing means such as, for example, by gluing. The closing mechanism can also consist of a shell embracing the body and the clasp and suitable for maintaining the clasp in its closed position.

The superparamagnetic core can be replaced with any core made of a magnetic material (for example a soft magnetic alloy composite) exhibiting curves similar to those of FIGS. 3A to 3C.

The superparamagnetic core is used here both as modulator of the magnetic excitation field as a function of the magnetic field to be measured and as magnetic flux concentrator. As a variant, the superparamagnetic core can be used in a magnetic field sensor solely as modulator or, alternatively, as flux concentrator.

The invention claimed is:
1. A magnetic core for implementation in a magnetic field sensor, wherein the magnetic core is made from a material comprising a solid matrix in which are dispersed superparamagnetic particles, the solid matrix being chosen so as not to perturb magnetic properties of the superparamagnetic particles, and wherein the superparamagnetic particles represent a percentage P of the total volume of the core chosen to be greater than 2.5%.

2. The magnetic core as claimed in claim 1, wherein the superparamagnetic particles are spaced sufficiently far apart so that the core is superparamagnetic.

3. The magnetic core as claimed in claim 1, wherein the superparamagnetic particles represent a percentage P of the total volume of the core chosen in the span defined by the relation L−10%≤P≤L−1% where L corresponds to a threshold L beyond which the core loses its superparamagnetic properties.

4. The magnetic core as claimed in claim 1, wherein the superparamagnetic particles represent a percentage P of the total volume of the core chosen to be greater than 15%.

5. The magnetic core as claimed in claim 1, wherein the matrix is made of plastic chosen from among the thermoplastics or the thermosets.

6. The magnetic core as claimed in claim 5, wherein the matrix is chosen from among the following thermosets: phenoplasts, aminoplasts, epoxy resins, unsaturated polyesters, crosslinked polyurethanes, alkyds.

7. The magnetic core as claimed in claim 5, wherein the matrix is chosen from among the following thermoplastics: polyvinyls, polyvinyl chlorides, polyvinyl acetates, polyvinyl alcohols, polystyrenes and copolymers, acrylic polymers, polyolefins, cellulose derivatives, polyamides.

8. The magnetic core as claimed in claim 1, wherein the matrix is chosen from among the following polymers: fluorinated polymers, silicones, synthetic rubber, saturated polyesters, linear polyurethanes, polycarbonates, polyacetals, polyphenylene oxides, polysulfones, polyethersulfones, phenylene polysulfides, polyimides, elastomers.

9. The magnetic core as claimed in claim 1, wherein the superparamagnetic particles exhibit a largest width of less than 100 nanometers.

10. The magnetic core as claimed in claim 1, wherein the superparamagnetic particles are chosen from among:
the oxides of iron,
the mixed oxides of iron and of another metal,
the oxides of nickel, of cobalt or the mixed oxides of these metals,
the magnetic metallic alloys.

11. The core as claimed in claim 10, wherein the superparamagnetic particles are chosen from among the mixed oxides of iron and of another metal chosen from among: Mn, Ni, Zn, Bi, Cu, Co.

12. The core as claimed in claim 10, wherein the superparamagnetic particles are chosen from among the oxides of iron $Fe_3O_4$ and $Fe_2O_3$.

13. The core as claimed in claim 10, wherein the superparamagnetic particles are chosen from among the metallic alloys of the type FeNi, CoNi, or $Fe_{20}Ni_{80}$.

14. The magnetic core as claimed in claim 1, wherein the magnetic core comprises a transducer (26, 28) embedded in the core and suitable for converting a magnetic field induced in the magnetic core into an electrical voltage or current.

15. The magnetic core as claimed in claim 1, wherein the magnetic core comprises at least one winding wound around the core.

16. The magnetic core as claimed in claim 1, wherein the magnetic core comprises at least one winding embedded in the core.

17. The magnetic core as claimed in claim 15, wherein the magnetic core comprises a connector (46) with lugs (48) for linking at least one of the group consisting of the transducer (26, 28) and the at least one winding.

18. The magnetic core as claimed in claim 1, wherein the magnetic core comprises a housing (14) intended to receive an electrical conductor (4) generating a magnetic field to be measured.

19. The magnetic core as claimed in claim 1, wherein the magnetic core is elastically deformable.

20. The magnetic core as claimed in claim 19, wherein the magnetic core comprises a body in which is made the housing (14) open on one side and closed by a clasp (16) displaceable between an open position and a closed position.

21. The magnetic core as claimed in claim 18, wherein the magnetic core is elastically deformable, and wherein the magnetic core exhibits a passage (58) for the introduction of the conductor (4), the passage (58) being enlargeable by elastic deformation of the core.

22. The magnetic core as claimed in claim 1, wherein the magnetic core's magnetic cycle is independent of the direction of the magnetic field.

23. A magnetic field sensor comprising at least one magnetic core (10; 56; 62) and an electronic circuit for measuring a magnetic field induced in the magnetic core, wherein the magnetic core complies with claim 1.

24. The sensor as claimed in claim 23, wherein the electronic circuit (12) comprises a source for generating an excitation field, and the induced magnetic field includes the magnetic excitation field.

25. The sensor as claimed in claim 24, wherein the electronic circuit (12) generates a feedback magnetic field suitable for permanently maintaining an amplitude of the induced magnetic field in an operating span [$H_{min}$; $H_{max}$] in which the magnetic core is never saturated.

26. The sensor as claimed in claim 24, wherein the electronic circuit (12) comprises at least one excitation winding (20) for creating the excitation field.

27. The sensor as claimed in claim 26, wherein the excitation winding (20) is embedded inside or wound around the magnetic core.

28. The sensor as claimed in claim 25, wherein the electronic circuit (12) extracts the amplitude of one or more of the harmonics of the field induced which is a multiple of the frequency of the excitation field, these extracted amplitudes being representative of the magnetic field to be measured.

29. The sensor as claimed in claim 28, wherein the electronic circuit extracts at least the amplitude of the harmonic that is twice the frequency of the excitation field.

30. The sensor as claimed in claim 23, wherein the core comprises:
a magnetic body (13) in which is formed a housing (14) suitable for receiving an electrical conductor radiating the magnetic field to be measured,
a clasp (16) displaceable between an open position for introducing the conductor into the housing, and a closed position in which the conductor is maintained in the housing, and
a closing mechanism (44) suitable for maintaining the clasp in its closed position, this mechanism being integral on one side with the clasp and on the other side with the body.

31. The sensor as claimed in claim 23, wherein,
a through-housing (14) and an access passage (58) to the housing are formed in the magnetic core, the housing for receiving an electrical conductor radiating the magnetic field to be measured, and the access passage being sufficiently narrow in the absence of exterior loading to retain the conductor inside the housing, and
under the action of an exterior force, the core is deformable elastically so as to allow enlargement of the passage (58) by reversible elastic deformation when the conductor has been fully introduced inside the housing.

32. A method of controlling a sensor as claimed in claim 23, comprising a step (51, 52) of generating an excitation field or a feedback field suitable for permanently maintaining an amplitude of the magnetic field induced in the core in an operating span $[H_{min}; H_{max}]$ in which the magnetic core is never saturated.

33. The magnetic core as claimed in claim 1, wherein the superparamagnetic particles exhibit a largest width of less than 20 nanometers.

34. A magnetic core for implementation in a magnetic field sensor,
wherein the magnetic core is made from a material comprising a solid matrix in which are dispersed superparamagnetic particles, the solid matrix being chosen so as not to perturb magnetic properties of the superparamagnetic particles, and
wherein the superparamagnetic particles represent a percentage P of the total volume of the core chosen in the span defined by the relation $L-10\% \leq P \leq L-1\%$ where L corresponds to a threshold L beyond which the core loses its superparamagnetic properties.

35. A magnetic field sensor, comprising:
a magnetic core made from a material comprising a solid matrix in which are dispersed superparamagnetic particles, the solid matrix being chosen so as not to perturb magnetic properties of the superparamagnetic particles; and
an electronic circuit for measuring a magnetic field induced in the magnetic core,
wherein the electronic circuit comprises a source for generating an excitation field, and the induced magnetic field includes the magnetic excitation field, and
wherein the electronic circuit generates a feedback magnetic field suitable for permanently maintaining an amplitude of the induced magnetic field in an operating span $[H_{min}; H_{max}]$ in which the magnetic core is never saturated.

* * * * *